(12) United States Patent
Chen

(10) Patent No.: US 11,264,586 B2
(45) Date of Patent: Mar. 1, 2022

(54) OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Caiqin Chen, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 690 days.

(21) Appl. No.: 16/095,708

(22) PCT Filed: Aug. 2, 2018

(86) PCT No.: PCT/CN2018/098326
§ 371 (c)(1),
(2) Date: Oct. 23, 2018

(87) PCT Pub. No.: WO2020/000577
PCT Pub. Date: Jan. 2, 2020

(65) Prior Publication Data
US 2021/0226156 A1    Jul. 22, 2021

(30) Foreign Application Priority Data

Jun. 28, 2018 (CN) .......................... 201810685206.0

(51) Int. Cl.
*G09G 5/00* (2006.01)
*H01L 51/52* (2006.01)
(Continued)

(52) U.S. Cl.
CPC ....... *H01L 51/5237* (2013.01); *G09G 3/3275* (2013.01); *H01L 27/3276* (2013.01)

(58) Field of Classification Search
CPC ............. H01L 27/3258; H01L 27/3262; H01L 51/0525; H01L 51/5253; H01L 51/5256;
(Continued)

(56) References Cited

U.S. PATENT DOCUMENTS

2005/0184927 A1   8/2005 Kwak
2006/0087229 A1   4/2006 Kim
(Continued)

FOREIGN PATENT DOCUMENTS

CN    1658713 A    8/2005
CN    1784091 A    6/2006
(Continued)

*Primary Examiner* — Insa Sadio
(74) *Attorney, Agent, or Firm* — Soroker Agmon Nordman

(57) ABSTRACT

The display panel of the present disclosure includes a substrate; an OLED device layer disposed on the substrate and having at least one through hole defined thereon; and a thin film package layer covering the OLED device layer and extending to the at least one through hole. As such, the thin film package layer can be attached to the OLED device layer. Attachment force of the thin film package layer can be enhanced by defining the through hole(s) in the OLED device layer and filling the through hole(s) with the thin film package layer, thereby avoiding phenomenon that films are peeled off.

17 Claims, 3 Drawing Sheets

(51) Int. Cl.
*G09G 3/3275* (2016.01)
*H01L 27/32* (2006.01)

(58) Field of Classification Search
CPC ............... H01L 21/312; H01L 51/0096; H01L 51/5246; Y02E 10/549; Y02P 70/50; Y02P 70/521
See application file for complete search history.

(56) References Cited

U.S. PATENT DOCUMENTS

| | | | |
|---|---|---|---|
| 2007/0291215 A1 | 12/2007 | Koo et al. | |
| 2018/0124933 A1 | 5/2018 | Park et al. | |
| 2018/0138452 A1* | 5/2018 | Kwak | ................ H01L 51/5253 |
| 2018/0331320 A1 | 11/2018 | Su et al. | |

FOREIGN PATENT DOCUMENTS

| | | |
|---|---|---|
| CN | 101090131 A | 12/2007 |
| CN | 203883009 U | 10/2014 |
| CN | 106816546 A | 6/2017 |
| CN | 106876328 A | 6/2017 |
| CN | 108039418 A | 5/2018 |

\* cited by examiner

OLED DISPLAY PANEL

BACKGROUND

Field

The present disclosure relates to a technological field of displays, and more particularly to an OLED display panel.

Background

Since OLED display panels are sensitive to outside water vapor and oxygen, thin film packages are utilized for blocking erosion of the water vapor and oxygen to ensure characteristics of the OLED display panels. However, in processes of manufacturing the OLED display panels, stress of thin films of tire packages is different from stress of films on lower substrates due to temperature differences in the processes. When the difference of the stresses is too large, the thin films of the packages are easily peeled off and thus the packages fail.

Consequently, defects exist in the prior art and urgently need to be improved.

SUMMARY OF THE DISCLOSURE

An objective of embodiments of the present disclosure is to provide an OLED display panel capable of avoiding that the thin films of the packages are peeled off.

An embodiment of the present disclosure provides an OLED display panel including a substrate; an OLED device layer, the OLED device layer being disposed on the substrate, and a plurality of through holes being defined in the OLED device layer; and a thin film package layer, the thin film package layer covering the OLED device layer and extending to the through holes, so that the thin film package layer is attached to the OLED device layer; wherein the OLED device layer includes a display area and a non-display area, and the through holes are disposed in the non-display area; the thin film package layer includes a first organic layer, an inorganic layer, and a second organic layer which are stacked on the OLED device layer in sequential.

In the OLED display panel of the present disclosure, the through holes include first through holes, second through holes, and third through holes, the first through holes are located in an edge of the display area, the third through holes are located in an edge of the thin film package layer, and the second through holes are located between the edge of the display area and the edge of the thin film package layer.

In the OLED display panel of the present disclosure, the display area includes a first side and a second side which are disposed opposite to each other, a thud side and a fourth side which are disposed opposite to each other, a first corner disposed between the first side and the third side, a second corner disposed between the first side and the fourth side, a third corner disposed between the second side and the third side, and a fourth corner disposed between the second side and the fourth side; the first through holes am disposed along the first corner, the second corner, the third corner, the fourth corner, and the second side; the second through holes and the third through holes are disposed along the first side, the third side, the fourth side, the first corner, the second corner, the third corner, and the fourth corner.

In the OLED display panel of the present disclosure, a power line and a driving chip of data signals are disposed in the non-display area, and each of the first through holes includes a first sub through hole and a second sub through hole; the first sub through hole is disposed between the display area and the power line, and the second sub through hole is disposed between the power line and the driving chip of data signals.

In the OLED display panel of the present disclosure, the through holes have different depths.

In the OLED display panel of the present disclosure, the through holes have different areas.

In the OLED display panel of the present disclosure, a plurality of sub power lines are disposed on the display area, the sub power lines extend to the non-display area and are connected to the power a plurality of line via first vias, and the first sub through hole is disposed between two adjacent ones of the sub power lines.

In the OLED display panel of the present disclosure, a plurality of driving lines of data signals are disposed on the display area, the driving lines of data signals extend to the non-display area and are connected to the driving chip of data signals via a plurality of second vias, and the second sub through hole is disposed between two adjacent ones of the driving lines of data signals.

In the OLED display panel of the present disclosure, the OLED device layer includes a fourth insulating layer, a third insulating layer, a second insulating layer, and a first insulating layer, and a luminescent function layer are stacked on the substrate in sequential; the through holes penetrate the first insulating layer and the second insulating layer and extend to the third insulating layer; or the through holes penetrate the first insulating layer, the second insulating layer, and the third insulating layer; or the third through holes penetrate the first insulating layer, the second insulating layer, and the third insulating layer and extend to the fourth insulating layer.

An embodiment of the present disclosure further provides an OLED display panel including a substrate; an OLED device layer, the OLED device layer being disposed on the substrate, and a plurality of through holes being defined in the OLED device layer; and a thin film package layer, the thin film package layer covering the OLED device layer and extending to the through holes, so that the thin film package layer is attached to the OLED device layer.

In the OLED display panel of the present disclosure, the OLED device layer includes a display area and a non-display area, and the through holes are disposed in the non-display area.

In the OLED display panel of the present disclosure, the through holes include first through holes, second through holes, and third through holes; the first through holes are located in an edge of the display area, the third through holes are located in an edge of the thin film package layer, and the second through holes are located between the edge of the display area and the edge of the thin film package layer.

In the OLED display panel of the present disclosure, the display area includes a first side and a second side which are disposed opposite to each other, a third side and a fourth side which are disposed opposite to each other, a first corner disposed between the first side and the third side, a second corner disposed between the first side and the fourth side, a third corner disposed between the second side and the third side, and a fourth corner disposed between the second side and the fourth side; the first through holes are disposed along the first corner, the second corner, the third corner, the fourth corner, and the second side, the second through holes and the third through holes are disposed along the first side, the third side, the fourth side, the first corner, the second corner, the third corner, and the fourth corner.

In the OLED display panel of the present disclosure, a power line and a driving chip of data signals are disposed in the non-display area, and each of the first through holes includes a first sub through hole and a second sub through hole; the first sub through hole is disposed between the display area and the power line, and the second sub through hole is disposed between the power line and the driving chip of data signals.

In the OLED display panel of the present disclosure, the through holes have different depths.

In the OLED display panel of the present disclosure, the through holes have different areas.

In the OLED display panel of the present disclosure, a plurality of sub power lines are disposed on the display area, the sub power lines extend to the non-display area and are connected to the power a plurality of line via first vias, and the first sub through hole is disposed between two adjacent ones of the sub power lines.

In the OLED display panel of the present disclosure, a plurality of driving lines of data signals are disposed on the display area, the driving lines of data signals extend to the non-display area and are connected to the driving chip of data signals via a plurality of second vias, and the second sub through hole is disposed between two adjacent ones of the driving lines of data signals.

In the OLED display panel of the present disclosure, the thin film package layer includes a first organic layer, an inorganic layer, and a second organic layer which are stacked on the OLED device layer in sequential.

In the OLED display panel of the present disclosure, the OLED device layer includes a fourth insulating layer, a third insulating layer, a second insulating layer, and a first insulating layer, and a luminescent function layer are stacked on the substrate in sequential; the through holes penetrate the first insulating layer and the second insulating layer and extend to the third insulating layer; or the through holes penetrate the first insulating layer, the second insulating layer, and the third insulating layer; or the third through holes penetrate the first insulating layer, the second insulating layer, and the third insulating layer and extend to the fourth insulating layer.

The display panel of the present disclosure includes a substrate; an OLED device layer disposed on the substrate and having at least one through hole defined thereon: and a thin film package layer covering the OLED device layer and extending to the at least one through hole. As such, the thin film package layer can be attached to the OLED device layer. Attachment force of the thin film package layer can be enhanced by defining the through hole(s) in the OLED device layer and filling the through hole(s) with the thin film package layer, thereby avoiding phenomenon that films are peeled off.

BRIEF DESCRIPTION OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

DETAILED DESCRIPTION OF THE PREFERRED EMBODIMENTS

Figure 1:
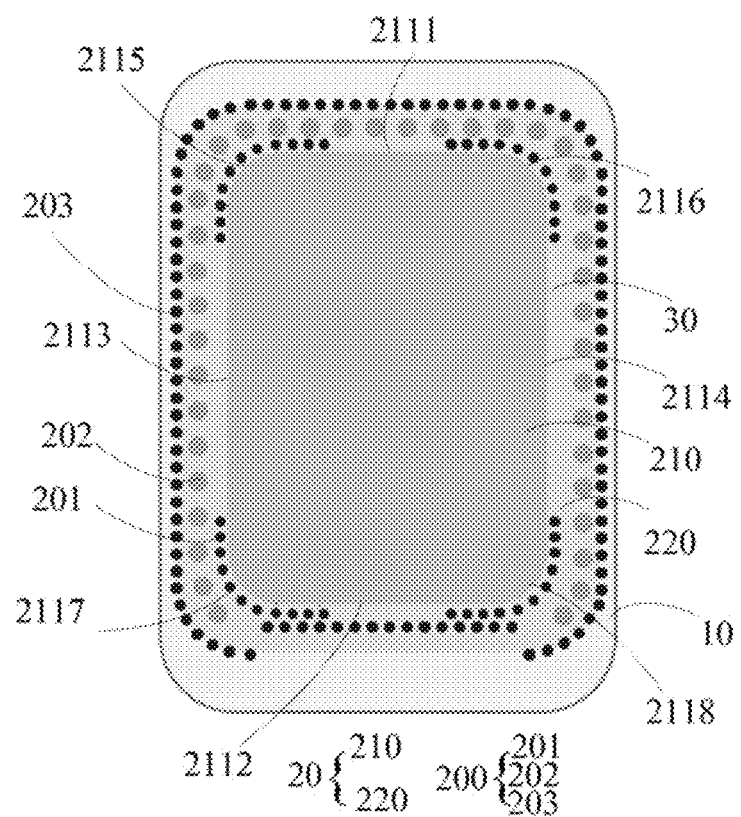
FIG. 1 illustrates an OLED display panel in accordance with an embodiment of the present disclosure.

Hereinafter, exemplary embodiments of the present disclosure will be described with reference to the accompanying drawings. The same or similar elements or the elements with the same or similar functions w ill be designated by the same or similar reference numerals throughout the following description and drawings. The following embodiments described with the accompanying drawings are merely exemplary to explain the present disclosure and not to be construed as limiting the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly, in the description of the present disclosure, the term "more" refers two or more than two, unless otherwise specifically defined.

In the description of the present disclosure, it should be noted that unless otherwise clearly defined and limited, the terms "mounted", "connected/coupled" and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Please refer to FIG. 1. FIG. 1 illustrates an OLED display panel in accordance with an embodiment of the present disclosure. As shown in FIG. 1 the OLED display panel in accordance with the embodiment of the present disclosure includes a substrate 10, an OLED device layer 20, and a thin film package layer 30. The OLED device layer 20 is disposed on the substrate 10. A plurality of through holes 200 are defined in the OLED device layer 20. The thin film package layer 30 covers the OLED device layer 20 and extends to the through holes 200, so that the thin film package layer 30 is attached to the OLED device layer 20.

The OLED device layer 20 includes a display area 210 and a non-display area 220. The non-display area 220 surrounds the display area 210. The through holes 200 are disposed in the non-display area 220, so that the OLED display panel can display an image normally. Furthermore, the thin film package layer 30 can be tightly combined with the OLED device layer 20, thereby improving packaging effect.

In some embodiments, the through holes 200 include first through holes 201, second through holes 202, and third through holes 203. The first through holes 201 are located in an edge of the display area 210. The third through holes 203 are located in an edge of the thin film package layer 30. The second through holes 202 are located between the edge of the display area 210 and the edge of the thin film package layer 30. In particularly, the first through holes 201 are located in an outer edge of the display area 210, and spacing is formed between the first through holes 201 and the display area 210. The spacing does not affect the display area 210 when the first through holes 201 are formed.

Further, the display area 210 includes a first side 2111, a second side 2112, a third side 2113, a fourth side 2114, a first corner 2115, a second corner 2116, a third corner 2117, and a fourth corner 2118 which are connected together. The first side 2111 is disposed opposite to the second side 2112. The third side 2113 is disposed opposite to the fourth side 2114. The first corner 2115 is disposed between the first side 2111 and the third side 2113. The second corner 2116 is disposed between the first side 2111 and the fourth side 2114. The third aimer 2117 is disposed between the second side 2112 and the third side 2113. The fourth corner 2118 is disposed between the second side 2112 and the fourth side 2114.

The first through holes 201 are disposed along the first corner 2115, the second corner 2116, the third corner 2117, the fourth corner 2118, and the second side 2112. That is, the first through holes 201 are disposed in the first corner 2115, the second corner 2116, the third corner 2117, the fourth corner 2118, and the second side 2112. The first through holes 201 are spaced.

The second through holes 202 and the third through holes 203 are disposed along the first side 2111, the third side 2113, the fourth side 2114, the first corner 2113, the second corner 2116, the third corner 2117, and the fourth corner 2118. That is, the second through holes 202 and the third through holes 203 are disposed in the first side 2111, the third side 2113, the fourth side 2114, the first corner 2115, the second corner 2116, the third corner 2117, and the fourth corner 2118. The first through holes 201 are spaced. The third through holes 203 are spaced. The second through holes 202 are closer to the display area 210 than the third through holes 203.

It is noted that the above descriptions of the through holes 200 are disposed in the non-display area 220. The through holes 200 can be disposed in the non-display area 20 according to the requirements of those skilled in the art. For example, the through holes 200 may be disposed only the along first side 2111, the second side 2112, the third side 2113, the fourth side 2114, the first corner 2115, the second corner 2116, the third corner 2117, or the fourth corner 2118.

Figure 2:
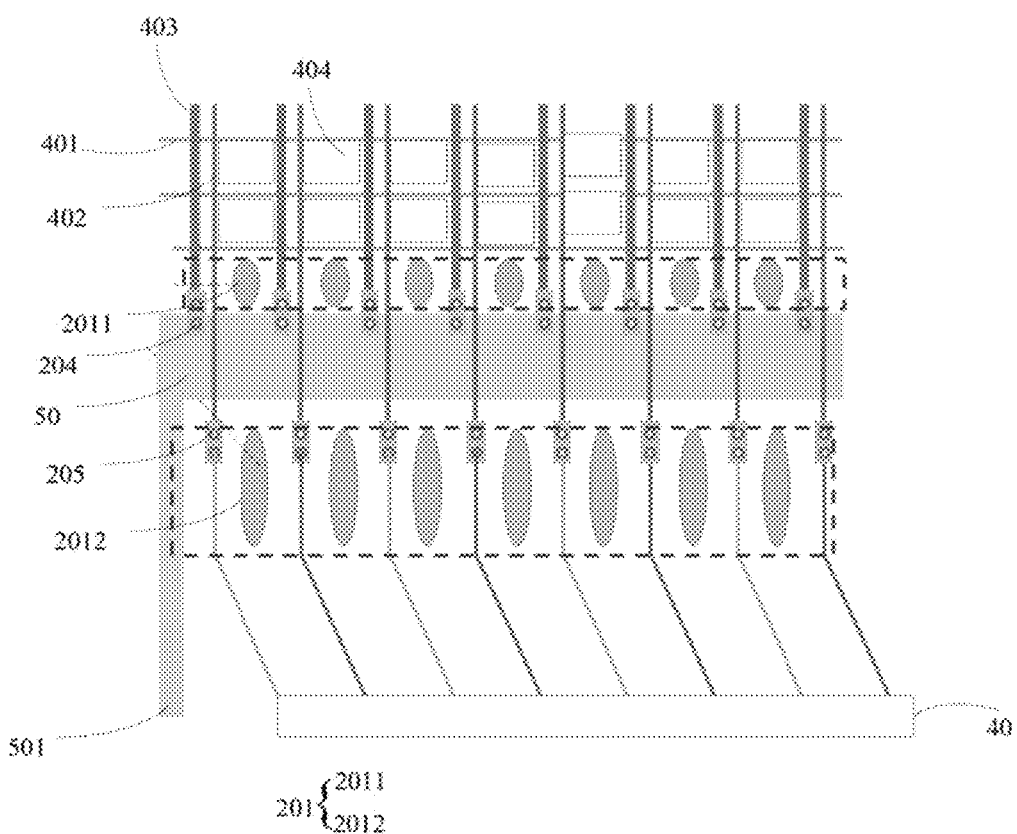
FIG. 2 illustrates a part of the OLED display panel in accordance with the embodiment of the present disclosure.

In some embodiments, please refer to FIG. 2. FIG. 2 illustrates a part of the OLED display panel in accordance with the embodiment of the present disclosure. As shown in FIG. 1 and FIG. 2, a plurality of driving lines 401 of scan signals, a plurality of driving lines 402 of data signals, a plurality of pixels 404 which are inlerlacedly defined by the driving lines 401 of scan signals and the driving lines 402 of data signals, and a plurality of sub power lines 403 are disposed on the display area 210. The driving lines 401 of scan signals are arranged in a first direction. The driving lines 402 of data signals are arranged in a second direction. The sub power lines 403 are arranged in the second direction. The first direction is perpendicular to the second direction. The driving lines 401 of scan signals, the driving lines 402 of data signals, and the sub power lines 403 drive the pixels 404 to light and display an image.

A power line 50 and a driving chip 40 of data signals are disposed in the non-display area 220 of the OLED display panel. The power line 50 is connected to a power supply terminal 501 of the OLED display panel. The sub power lines 403 extend to the non-display area 220 and are connected to the power line 50 via a plurality of first vias 204. The driving lines 402 of data signals extend to the non-display area 220 and are connected to the driving chip 40 of data signals via a plurality of second vias 205.

Each of the first through holes 201 includes a first sub through hole 2011 and a second sub through hole 2012. The first sub through hole 2011 is disposed between the display area 210 and the power line 50. The second sub through hole 2012 is disposed between the power line 50 and the driving chip 50 of data signals.

Further, the first sub through hole 2011 is disposed between two adjacent ones of the sub power lines 403. The second sub through hole 2012 is disposed between two adjacent ones of the driving lines 402 of data signals.

Figure 3:
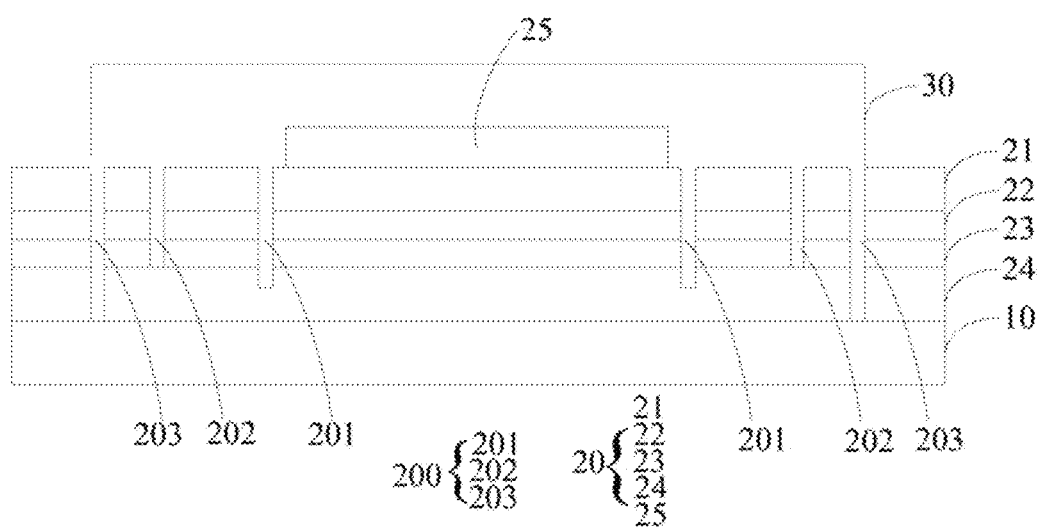
FIG. 3 illustrates a cross-sectional view of the OLED display panel in FIG. 1 along a direction A-A.

Please refer to FIG. 3. FIG. 3 illustrates a cross-sectional view of the OLED display panel in FIG. 1 along a direction A-A. As shown in FIG. 1 and FIG. 3, the OLED device layer includes a fourth insulating layer 24, a third insulating layer 23, a second insulating layer 22, and a first insulating layer 21, a luminescent function layer, and a thin film package layer 30 which are stacked on the substrate 10 in sequential. The through holes 200 are disposed in the non-display area 220. The through holes 200 include the first through holes 201, the second through holes 202, and the third through holes 203. The thin film package layer 30 extends to the first through holes 201, the second through holes 202, and the third through holes 203, so that the thin film package layer 30 can be tightly combined with the fourth insulating layer 24, the third insulating layer 23, the second insulating layer 22, and the first insulating layer 21, and packaging effect can be improved.

The through holes 200 have different depths. A depth of the through holes 200 in an outermost peripheral of the display area 210 is greater than a depth of other through holes 200. As such, the thin film package layer 30 can extend to the through holes 200 in the outermost peripheral of the display area 210 and does not spill. That is, a depth of the first through holes 201 is greater than a depth of the second through holes 202. A depth of the third through holes 203 is greater than the depth of the first through holes 202. In detail, the second through holes 202 penetrate the first insulating layer 21 and the second insulating layer 22 and extend to the third insulating layer 23. The first through holes 201 penetrate the first insulating layer 21, the second insulating layer 22, and the third insulating layer 23. The third through holes 203 penetrate the first insulating layer 21, the second insulating layer 22, and the third insulating layer 23 and extend to the fourth insulating layer 24.

The through holes 200 have different areas. That is, those skilled in the art can flexibly design the areas of the holes 200 according to requirements, thereby avoiding wirings in the non-display area 220.

Figure 4:
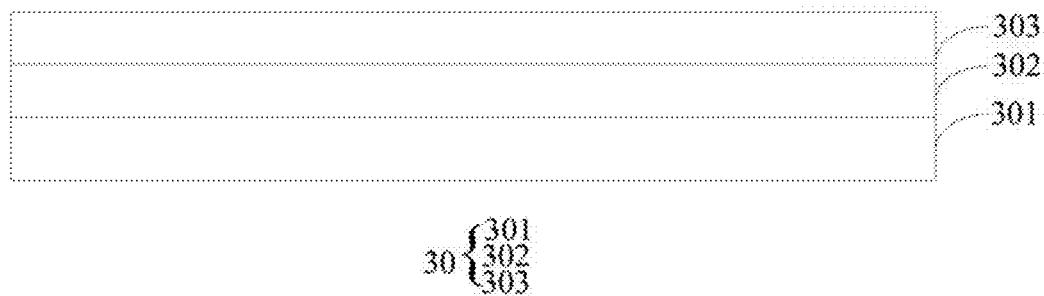
FIG. 4 illustrates a structural diagram of the thin film package layer in the OLED display panel in accordance with an embodiment of the present disclosure.

Please refer to FIG. 4. FIG. 4 illustrates a structural diagram of the thin film package layer in the OLED display panel in accordance with an embodiment of the present disclosure. As shown in FIG. 1 and FIG. 4, the thin film package layer 30 includes a first organic layer 301, an inorganic layer 302, and a second organic layer 303 which are stacked on the OLED device layer 20 in sequential. In the present embodiment of the present disclosure, the first organic layer 301 extends to the through holes 200, so that the thin film package layer 30 is attached to the OLED device layer 20 and the package effect is improved.

The display panel of the present disclosure includes a substrate; an OLED device layer disposed on the substrate and having at least one through hole defined thereon; and a thin film package layer covering the OLED device layer and extending to the at least one through hole. As such, the thin film package layer can be attached to the OLED device layer. Attachment force of the thin film package layer can be enhanced by defining the through hole(s) in the OLED device layer and filling the through hole(s) with the thin film package layer, thereby avoiding phenomenon that films are peeled off.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. An OLED display panel, comprising:
    a substrate;
    an OLED device layer, the OLED device layer being disposed on the substrate, and a plurality of through holes being defined in the OLED device layer; and
    a thin film package layer, the thin film package layer covering the OLED device layer and extending to the through holes, so that the thin film package layer is attached to the OLED device layer;
    wherein the OLED device layer comprises a display area and a non-display area, and the through holes are disposed in the non-display area;
    the thin film package layer comprises a first organic layer, an inorganic layer, and a second organic layer which are stacked on the OLED device layer in sequential the through holes comprise first through holes, second through holes, and third through holes;
    the first through holes are located in an edge of the display area, the third through holes are located in an edge of the thin film package layer, and the second through holes are located between the edge of the display area and the edge of the thin film package layer;
    the display area comprises a first side and a second side which are disposed opposite to each other, a third side and a fourth side which are disposed opposite to each other, a first corner disposed between the first side and the third side, a second corner disposed between the first side and the fourth side, a third corner disposed between the second side and the third side, and a fourth corner disposed between the second side and the fourth side;
    the first through holes are disposed along the first corner, the second corner, the third corner, the fourth corner, and the second side; and
    the second through holes and the third through holes are disposed along the first side, the third side, the fourth side, the first corner, the second corner, the third corner, and the fourth corner.

2. The OLED display panel of claim 1, wherein a power line and a driving chip of data signals are disposed in the non-display area, and each of the first through holes comprises a first sub through hole and a second sub through hole; the first sub through hole is disposed between the display area and the power line, and the second sub through hole is disposed between the power line and the driving chip of data signals.

3. The OLED display panel of claim 2, wherein the through holes have different depths.

4. The OLED display panel of claim 2, wherein the through holes have different areas.

5. The OLED display panel of claim 2, wherein a plurality of sub power lines are disposed on the display area, the sub power lines extend to the non-display area and are connected to the power a plurality of line via first vias, and the first sub through hole is disposed between two adjacent ones of the sub power lines.

6. The OLED display panel of claim 2, wherein a plurality of driving lines of data signals are disposed on the display area, the driving lines of data signals extend to the non-display area and are connected to the driving chip of data signals via a plurality of second vias, and the second sub through hole is disposed between two adjacent ones of the driving lines of data signals.

7. The OLED display panel of claim 1, wherein the OLED device layer comprises a fourth insulating layer, a third insulating layer, a second insulating layer, and a first insulating layer, and a luminescent function layer are stacked on the substrate in sequential;
    the through holes penetrate the first insulating layer and the second insulating layer and extend to the third insulating layer; or
    the through holes penetrate the first insulating layer, the second insulating layer, and the third insulating layer; or the third through holes penetrate the first insulating layer, the second insulating layer, and the third insulating layer and extend to the fourth insulating layer.

8. An OLED display panel, comprising:
a substrate;
an OLED device layer, the OLED device layer being disposed on the substrate, and a plurality of through holes being defined in the OLED device layer; and
a thin film package layer, the thin film package layer covering the OLED device layer and extending to the through holes, so that the thin film package layer is attached to the OLED device
wherein the OLED device layer comprises a fourth insulating layer, a third insulating layer, a second insulating layer, and a first insulating layer, and a luminescent function layer are stacked on the substrate in sequential;
the through holes penetrate the first insulating layer and the second insulating layer and extend to the third insulating layer; or
the through holes penetrate the first insulating layer, the second insulating layer, and the third insulating layer; or
the third through holes penetrate the first insulating layer, the second insulating layer, and the third insulating layer and extend to the fourth insulating layer.

9. The OLED display panel of claim 8, wherein the OLED device layer comprises a display area and a non-display area, and the through holes are disposed in the non-display area.

10. The OLED display panel of claim 9, wherein the through holes comprise first through holes, second through holes, and third through holes;
the first through holes are located in an edge of the display area, the third through holes are located in an edge of the thin film package layer, and the second through holes are located between the edge of the display area and the edge of the thin film package layer.

11. The OLED display panel of claim 10, wherein the display area comprises a first side and a second side which are disposed opposite to each other, a third side and a fourth side which are disposed opposite to each other, a first corner disposed between the first side and the third side, a second corner disposed between the first side and the fourth side, a third corner disposed between the second side and the third side, and a fourth corner disposed between the second side and the fourth side;
the first through holes are disposed along the first corner, the second corner, the third corner, the fourth corner, and the second side;
the second through holes and the third through holes are disposed along the first side, the third side, the fourth side, the first corner, the second corner, the third corner, and the fourth corner.

12. The OLED display panel of claim 11, wherein a power line and a driving chip of data signals are disposed in the non-display area, and each of the first through holes comprises a first sub through hole and a second sub through hole;
the first sub through hole is disposed between the display area and the power line, and the second sub through hole is disposed between the power line and the driving chip of data signals.

13. The OLED display panel of claim 12, wherein the through holes have different depths.

14. The OLED display panel of claim 12, wherein the through holes have different areas.

15. The OLED display panel of claim 12, wherein a plurality of sub power lines are disposed on the display area, the sub power lines extend to the non-display area and are connected to the power a plurality of line via first vias, and the first sub through hole is disposed between two adjacent ones of the sub power lines.

16. The OLED display panel of claim 12, wherein a plurality of driving lines of data signals are disposed on the display area, the driving lines of data signals extend to the non-display area and are connected to the driving chip of data signals via a plurality of second vias, and the second sub through hole is disposed between two adjacent ones of the driving lines of data signals.

17. The OLED display panel of claim 8, wherein the thin film package layer comprises a first organic layer, an inorganic layer, and a second organic layer which are stacked on the OLED device layer in sequential.

* * * * *